(12) United States Patent
Moyama

(10) Patent No.: US 8,328,999 B2
(45) Date of Patent: Dec. 11, 2012

(54) METHOD FOR CONTROLLING FILM FORMING APPARATUS, FILM FORMING METHOD, FILM FORMING APPARATUS, ORGANIC EL ELECTRONIC DEVICE, AND STORAGE MEDIUM HAVING PROGRAM FOR CONTROLLING FILM FORMING APPARATUS STORED THEREIN

(75) Inventor: Kazuki Moyama, Amagasaki (JP)

(73) Assignee: Tokyo Electron Limited (JP)

( * ) Notice: Subject to any disclaimer, the term of this patent is extended or adjusted under 35 U.S.C. 154(b) by 345 days.

(21) Appl. No.: 12/680,021

(22) PCT Filed: Sep. 18, 2008

(86) PCT No.: PCT/JP2008/066850
§ 371 (c)(1),
(2), (4) Date: Mar. 25, 2010

(87) PCT Pub. No.: WO2009/041344
PCT Pub. Date: Apr. 2, 2009

(65) Prior Publication Data
US 2010/0207515 A1    Aug. 19, 2010

(30) Foreign Application Priority Data

Sep. 28, 2007  (JP) .................................. 2007-254989

(51) Int. Cl.
*C23C 14/34* (2006.01)
(52) U.S. Cl. ......... 204/192.14; 204/192.15; 204/192.26; 204/192.29
(58) Field of Classification Search ............. 204/192.15, 204/192.26, 192.27, 192.28, 192.29, 192.14
See application file for complete search history.

(56) References Cited

U.S. PATENT DOCUMENTS 5,482,603 A * 1/1996 Kawashima et al. .... 204/192.26
2003/0146088 A1 * 8/2003 Kim ......................... 204/192.26

FOREIGN PATENT DOCUMENTS

JP    2005-216724    8/2005
(Continued)

OTHER PUBLICATIONS

L.S. Hung et al., Enhanced electron injection in organic electroluminescence devices using an Al/LiF electrode, Appl. Phys. Lett., vol. 70, No. 2, Jan. 13, 1997, pp. 152-154.

(Continued)

*Primary Examiner* — Rodney McDonald
(74) *Attorney, Agent, or Firm* — Cantor Colburn LLP

(57) ABSTRACT

A material having a low work function is quickly inserted near an interface between an organic layer and a cathode. A sputtering apparatus (Sp) includes a target material formed of silver (Ag), a dispenser formed outside a processing container and evaporating cesium (Cs) having a lower work function than silver (Ag) by heating the cesium (Cs), a first gas supply pipe communicating with the dispenser to transfer evaporated cesium (Cs) to the processing container by using argon gas as a carrier gas, and a high frequency power supply source supplying high frequency power to the processing container. A controller generates plasma by exciting the argon gas by using energy of the high frequency power, and while forming a metal electrode by using an silver (Ag) atom, wherein the Ag atom is generated from a the target material by using the generated plasma, controls a ratio of the cesium (Cs) mixed with the metal electrode.

11 Claims, 8 Drawing Sheets

FOREIGN PATENT DOCUMENTS

JP    2007-227086    9/2007

OTHER PUBLICATIONS

F. Li et al., Fabrication and electroluminescence of double-layered organic light-emitting diodes with the Al2O3/Al cathode, Appl. Phys. Lett., vol. 70, No. 10, Mar. 10, 1997, pp. 1233-1235.

International Search Report-PCT/JP2008/066850 dated Oct. 14, 2008.

Kuniaki Tanaka et al., Deposition of SrO Thin Films on Alq and Its Application to EL Device, (Japanese) Institute of Electronics, Information and Communication Engineers, C-II, vol. J82-C-II, No. 2, Feb. 1999, pp. 70-71.

\* cited by examiner

METHOD FOR CONTROLLING FILM FORMING APPARATUS, FILM FORMING METHOD, FILM FORMING APPARATUS, ORGANIC EL ELECTRONIC DEVICE, AND STORAGE MEDIUM HAVING PROGRAM FOR CONTROLLING FILM FORMING APPARATUS STORED THEREIN

TECHNICAL FIELD

The present invention relates to a method of controlling a film-forming apparatus, a film-forming apparatus of a cathode, an organic EL electronic device, and a storage medium having recorded thereon a program having processing procedure to be executed on a computer the method so as to control a film-forming apparatus.

BACKGROUND ART

Recently, an organic EL(electroluminescence) display that uses an organic EL is element emitting light using an organic compound has attracted attentions. Since organic EL elements self-illuminate, provide a fast response, and consume low power, they do not require a backlight. Such organic EL elements are anticipated to be applied to, for example, display units of portable apparatuses.

An organic EL element is formed on a glass substrate and has a structure in which an organic layer is sandwiched between an anode and a cathode. When a current flows in the organic EL element by applying several external voltages, an electron is injected into the organic layer from the cathode and a hole is injected into the organic layer from the anode. When the electron and the hole are injected into the organic layer, an organic molecule is excited. When the excited organic molecule turns back to a ground state as the electron and the hole are recombined, surplus energy is emitted as light.

An organic EL element having high performance may be manufactured when the electron can be efficiently injected from the cathode side into the organic layer by lowering an electron injection barrier while injecting the electron into the organic layer. Accordingly, an electron injection layer formed of a material having a low work function, such as an alkali metal, is generally formed on an interface between the organic layer and the cathode, as disclosed in Non-Patent Documents 1 through 3.

For example, Non-Patent Document 1 discloses that a lithium fluoride (LiF) layer is inserted between a cathode layer formed of aluminum and an electron transport layer, so as to efficiently inject an electron into an organic layer. An alkali metal, such as lithium (Li) or cesium (Cs), has a small work function, and thus may be used to form an electron injection layer.

Non-Patent Document 2 discloses that an alumina ($Al_2O_3$) layer is inserted between a cathode layer formed of aluminum and an organic layer ($Alq_3$). Non-Patent Document 3 discloses that a strontium oxide (SrO) layer is inserted between a cathode layer formed of aluminum and an organic layer ($Alq_3$).

Conventional examples of a method of forming an electron injection layer include a vacuum deposition method and a deposition method using an alkali dispenser. Also, the vacuum deposition method is generally used to form a cathode constituting an upper layer of the electron injection layer. Recently, considering the uniformity of deposition of material and an increasing size of a substrate, a sputtering method is is mostly used to form an uniform layer on a large substrate.

In the film-forming process, the cathode may be formed as soon as possible after forming the electron injection layer so as to cover the electron injection layer with the cathode. This is because, as disclosed in Non-Patent Document 1, a material having a low work function is active, and thus may easily react with moisture, nitrogen, oxygen, or the like in a chamber, even when the chamber is in a high vacuum state.

(Non-Patent Document 1) "Enhanced electron injection in organic electroluminescence device using an Al/LiF electrode" 1997 American Institute of Physics, Appl. Phys. Lett. 70(2), 13 Jan. 1997

(Non-Patent Document 2) "Fabrication and electroluminescence of double-layered organic light-emitting diodes with the $Al_2O_3$/Al cathode" 1997 American Institute of Physics, Appl. Phys. Lett. 70(10), 10 Mar. 1997

(Non-Patent Document 3) "Thin Film Formation of Strontium Oxide onto Alq and Application to EL Device" (Japanese) Institute of Electronics, Information and Communication Engineers, C-II, Vol. J82-C-II, No. 2, pp. 70-71, February 1999

DISCLOSURE OF THE INVENTION

Technical Problem

In order to form a cathode as soon as possible after forming an electron injection layer, vacuum deposition for forming an alkali metal layer, or the like and sputtering for forming a cathode may be consecutively performed in the same chamber. However, the vacuum deposition for forming an alkali metal layer, or the like and the sputtering for forming a cathode use different operation pressures. In other words, while forming the alkali metal layer, or the like, the chamber needs to be maintained in a desired vacuum state (depressurized state). On the other hand, while forming the cathode, a sputtering gas needs to be supplied to the chamber before forming the cathode, and at this time, the pressure of the chamber inevitably increases to some degree. Accordingly, the film such as alkali metal, and the cathode cannot be consecutively formed according to the operation principle.

Moreover, in order to consecutively perform the sputtering of a cathode after the vacuum deposition in the same chamber, unnecessary alkali metal gas, or the like needs to be exhausted to the outside so that the alkali metal gas, or the like used is during the vacuum deposition does not flow toward a sputtering film-forming mechanism, and the sputtering needs to be performed by introducing a sputtering gas in a state that the gas such as alkali metal, and the sputtering gas are no longer mixed with each other. Thus, it is difficult to perform the sputtering of a cathode consecutively after the vacuum deposition.

Alternatively, there may be a film-forming method for mixing an alkali metal in the cathode, by preparing a target material in which the alkali metal is mixed and then sputtering the target material. However, as described above, since the alkali metal is active, the target material mixed with the alkali metal is immediately oxidized. Accordingly, the target material mixed with the alkali metal is difficult to be manufactured, stored, or transported, and thus is not suitable for mass-production.

Alternatively, an alkali metal, such as lithium, and a metal for cathode, such as silver or aluminum, may be put into each container in the same chamber, and evaporated, thus, each of the evaporated gases being mixed together while being diffused, and then deposited on a target object. However here, controllability is inferior, and it is difficult to precisely control a ratio of the alkali metal mixed in the cathode considering electron injection efficiency, and to precisely control the alkali metal to be uniformly mixed in the cathode.

Therefore, to address this problem, the present invention provides a method of controlling a film-forming apparatus for quickly inserting a material having a low work function near an interface between an organic layer and a cathode, the film-forming method, the film-forming apparatus, an organic EL electronic device, and a storage medium recorded thereon a program for the control.

Technical Solution

To solve the above-mentioned problems, according to an aspect of the present invention, there is provided a method of controlling a film-forming apparatus for forming a cathode on an organic layer formed on a target object in a processing container, wherein the film-forming apparatus includes: a target material formed in the processing container and of a first metal constituting a main material of the cathode; an evaporation source formed outside the processing container and evaporating a second metal having a lower work function than the first metal by heating the second metal; a is first gas supply path communicating with the evaporation source to transport steam of the evaporated second metal to the processing container by using an inert gas; and an energy source supplying desired energy to the processing container, the method including: generating plasma by exciting the inert gas supplied from the first gas supply path by using the supplied energy, and controlling a ratio of the second metal mixed in the cathode while forming the cathode by using a target atom of the first metal, wherein the target atom is generated from the target material when the target material contacts the generated plasma.

According to the method, when the cathode is formed by using the target atom of the first metal, the ratio of the second metal mixed in the cathode under formation is controlled. Accordingly, by mixing the second metal having the low work function in the cathode while forming the cathode, substantially, the cathode and an electron injection layer may be simultaneously formed. As a result, an atom of the second metal that is active may be prevented from reacting with moisture, nitrogen, oxygen, or the like remaining in the processing container. Thus, a highly efficient organic EL electronic device having high electron injection efficiency may be stably manufactured.

Here, the ratio of the second metal injected into the cathode under formation is very important. This is well known from a research result that in a conventional organic EL electronic device manufactured by stacking an electron transport layer, an eletron injection layer, and a cathode on a luminescent layer, a thickness of an alkali metal forming the electron injection layer may be relatively smaller than a thickness of the cathode. For example, it has been reported that the thickness of the alkali metal, such as lithium, may be from about 0.5 to about 2.0 nm, and if the thickness is higher, electron injection efficiency is deteriorated.

Accordingly, considering importance of the ratio of the second metal mixed in the cathode in the invention, the method of controlling the ratio of the second metal mixed in the cathode may control a temperature of the evaporation source formed outside the processing container. Accordingly, an evaporation rate of the second metal contained in the evaporation source may be controlled. In other words, when the temperature of the evaporation source is increased, the evaporation rate of the second metal is increased, thereby increasing the ratio of the second metal mixed in the cathode. On the other hand, when the temperature of the evaporation source is decreased, the is evaporation rate of the second metal is decreased, thereby decreasing the ratio of the second metal mixed in the cathode. In order to control the temperature of the evaporation source, a voltage applied to a power supply source of the evaporation source or a current supplied to the power supply source of the evaporation source may be controlled.

Alternatively, the method of controlling the ratio of the second metal mixed in the cathode may control a flow rate of the inert gas. The inert gas is used as a carrier gas for transferring the second metal. Accordingly, by relatively increasing the flow rate of the inert gas with respect to the evaporated second metal, the amount of the second metal (evaporated molecules) transported per unit hour is increased, thereby relatively increasing the ratio of the second metal mixed in the cathode. On the other hand, by relatively decreasing the flow rate of the inert gas with respect to the evaporated second metal, the ratio of the second metal mixed in the cathode may be relatively reduced.

In the controlling of the temperature, some time is required for the evaporation source to actually reach a desired temperature after changing a voltage or a current, and thus a reaction is inferior. However, the controlling of the flow rate of the insert gas has better reaction than the controlling of the temperature. Accordingly, the amount of the second metal mixed in the cathode under formation may be accurately controlled by roughly controlling the amount of the second metal by controlling the temperature, and then precisely controlling the amount of the second metal by controlling the flow rate of the inert gas.

The film-forming apparatus may further include a second gas supply path supplying a sputtering gas to the processing container, wherein the ratio of the second metal mixed in the cathode may be controlled by controlling a flow rate of the sputtering gas supplied from the evaporated second gas supply path.

When the flow rate of the sputtering gas is relatively increased with respect to the evaporated second metal, a component ratio of the second metal in the gas may be decreased, thereby relatively decreasing the ratio of the second metal mixed in the cathode. On the other hand, when the flow rate of the sputtering gas is relatively decreased with respect to the second metal, the component ratio of the second metal in the gas may be increased, thereby relatively increasing the ratio of the is second metal mixed in the cathode.

The ratio of the second metal mixed in the cathode may be controlled by controlling a ratio of a total flow rate of a gas supplied from the first gas supply path to the processing container to a total flow rate of a gas supplied from the second gas supply path to the processing container.

The temperature of the evaporation source may be controlled so as to stop supplying the second metal from the first gas supply path, after forming a thin film, in which the second metal is mixed in the first metal, to a desired thickness.

The first gas supply path may stop supplying a gas and only the sputtering gas may be supplied from the second gas supply path to the processing container, after forming a thin film, in which the second metal is mixed in the first metal, to a desired thickness.

Accordingly, a cathode layer in which the second metal is mixed, and a cathode layer in which the second metal is not mixed may be formed. Thus, by adjusting the thickness of the cathode layer in which the second metal is mixed, the highly efficient EL electronic device having the high electron injection efficiency may be manufactured.

The total flow rate of the gas supplied from the first gas supply path to the processing container may be controlled to be relatively decreased with respect to the total flow rate of the gas supplied from the second gas supply path to the processing container.

An amount of the evaporated second metal supplied from the first gas supply path to the processing container may be controlled to be relatively decreased with respect to the flow rate of the inert gas supplied from the first gas supply path to the processing container.

Accordingly, the cathode may be formed while gradually decreasing a mixing amount of the evaporated second metal. Thus, the second metal may be mixed in the cathode in such a way that a mixed ratio of the second metal increases toward the organic layer and decreases away from the organic layer. In this manner, the highly efficient EL electronic device having the high electron injection efficiency may be manufactured.

A pipe for forming the first gas supply path may be controlled to be 400° C. or higher. Here, when the evaporated second metal is transferred through the first gas supply path by using the inert gas as a carrier gas, the second metal may is be prevented from being liquefied by being adhered to a pipe forming the first gas supply path. Accordingly, the ratio of the second metal mixed in the cathode may be precisely controlled, while increasing an efficiency of use of material.

The second metal may be an alkali metal having a low work function. Examples of the alkali metal include lithium, sodium, potassium, rubidium, and cesium. By using such a second metal, electron injection efficiency may be increased. Also, the first metal may be silver or aluminum having low electric resistance and high reflectivity.

To solve the above-mentioned problems, according to another aspect of the present invention, there is provided a film-forming method for forming a cathode on an organic layer formed on a target object in a processing container, the film-forming method including: evaporating a second metal having a lower work function than a first metal constituting a main material of the cathode by heating the second metal by using an evaporation source formed outside the processing container; transferring steam of the evaporated second metal to the processing container through a first gas supply path connected to the evaporation source, by using an inert gas as a carrier gas; supplying desired energy to the processing container; and generating plasma by exciting the inert gas supplied from the first gas supply path by using the supplied energy, and mixing the second metal in the cathode while the cathode is formed by using a target atom of the first metal, wherein the target atom is generated from the target material when the target material contacts the generated plasma.

To solve the above-mentioned problems, according to another aspect of the present invention, there is provided a film-forming apparatus for forming a cathode on an organic layer formed on a target object in a processing container, the film-forming apparatus including: a target material formed in the processing container and formed of a first metal constituting a main material of the cathode; an evaporation source formed outside the processing container and evaporating a second metal having a lower work function than the first metal by heating the second metal; a first gas supply path communicating with the evaporation source to transport the evaporated second metal to the processing container by using an inert gas; an energy source supplying desired energy to the processing container; and a controller for generating plasma by exciting the inert gas supplied from the first gas supply path by using the supplied energy, and controlling a ratio of the second metal mixed in the cathode while is forming the cathode by using a target atom of the first metal, wherein the target atom is generated from the target material when the target material contacts the generated plasma.

To solve the above-mentioned problems, according to another aspect of the present invention, there is provided an organic EL electronic device manufactured by controlling a film-forming apparatus according to the above method.

To solve the above-mentioned problems, according to another aspect of the present invention, there is provided a storage medium having recorded thereon a program having processing procedure to be executed on a computer so as to control a film-forming apparatus by using the above-mentioned method.

As such, an electron injection layer and the cathode may be simultaneously formed by mixing the second metal having a low work function in the cathode while forming the cathode. As such, an atom of the second metal may be prevented from reacting with moisture, nitrogen, oxygen, or the like remaining in the processing container. Accordingly, a highly efficient EL electronic device having high electron injection efficiency may be manufactured.

Advantageous Effects

As described above, according to the present invention, a material having a low work function can be quickly inserted near an interface between an organic layer and a cathode.

EXPLANATION OF REFERENCE NUMERALS

Figure 1:
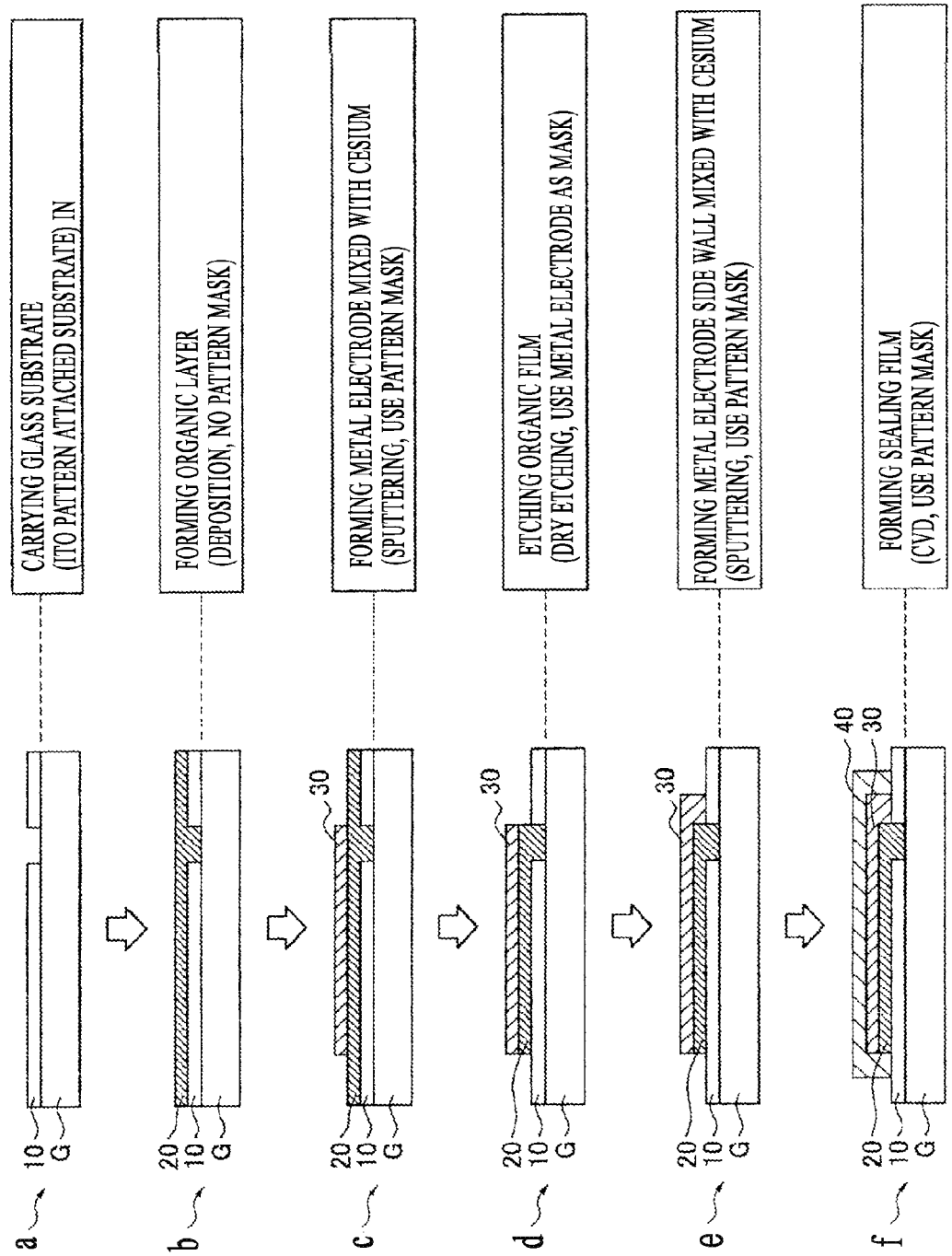
FIG. 1 is a diagram showing a process of manufacturing an organic EL electronic device, according to an embodiment of the present invention.

10: ITO
20: Organic Layer
30: Metal Electrode
40: sealing Film
50: Controller
100, 200, 300: Processing Containers
305*a*, 305*b*: Target Materials
310*a*, 310*b*: Packing Plates
315*a*, 315*b*: Target Holders
320*a*, 320*b*: Magnetic-Field Generating Means
110*a*, 325: Stage
330: Exhaust Pipe
335, 355: Vacuum Pumps
340: Gas Shower Head 345: First Gas Supply Pipe
350: Second Gas Supply Pipe
360, 365: Argon Gas Supply Source
370: DC Source
G: Substrate
Sys: Substrate-Processing System
PM1, PM2, PM3, PM4: Process Modules
Sp: Sputtering Apparatus
Ds: Dispenser
Ds1: Evaporation Container
Ds2: Power Supply Source Mode for Carrying out the Invention Hereinafter, embodiments of the present invention will be described in detail with reference to the attached drawings. Like reference numerals in the attached drawings and the below description denote like elements, and thus a detailed description thereof will not be repeated.

(Process of Manufacturing Organic EL Electronic Device)

First, a process of manufacturing an organic EL electronic device, according to an embodiment of the present invention will be described with reference to FIG. 1. As shown in "a" of FIG. 1, a glass substrate G (hereinafter, referred to as a substrate G), on which an indium tin oxide (ITO) 10 is formed, is carried into a deposition apparatus, and an organic layer 20 is formed on the ITO 10 (an anode), as shown in "b" of FIG. 1.

Then, the substrate G is transferred to a sputtering apparatus, and a sputtering atom (Ag) is generated by colliding a sputtering material formed of silver (Ag) with an ion of an argon gas. The generated sputtering atom (Ag) is accumulated on the organic layer 20 via a pattern mask, while being mixed with cesium (Cs) supplied to the sputtering apparatus. Accordingly, a metal electrode 30 (a cathode) mixed with cesium is formed, as shown in "c" of FIG. 1.

Next, the substrate G is transferred to an etching apparatus, and the organic layer 20 is dry etched by using the metal electrode 30 as a mask, by plasma generated by exciting an etching gas supplied into a container. Accordingly, as shown in "d" of FIG. 1, only the organic layer 20 disposed below the metal electrode 30 is left on the substrate G.

The substrate G is then transferred back to the sputtering apparatus, and the metal electrode 30 (a side wall) is formed by using a pattern mask via the above-mentioned sputtering, as shown in "e" of FIG. 1.

Then, the substrate G is transferred to a CVD apparatus, such as a radial line slot antenna (RLSA) plasma CVD apparatus, and an sealing film 40 formed of, for example, hydrogenated silicon nitride(H:SiNx), is formed by using a pattern mask as shown in "f" of FIG. 1. Accordingly, the organic EL element is sealed, and thus is is protected from external moisture or the like.

Figure 2:
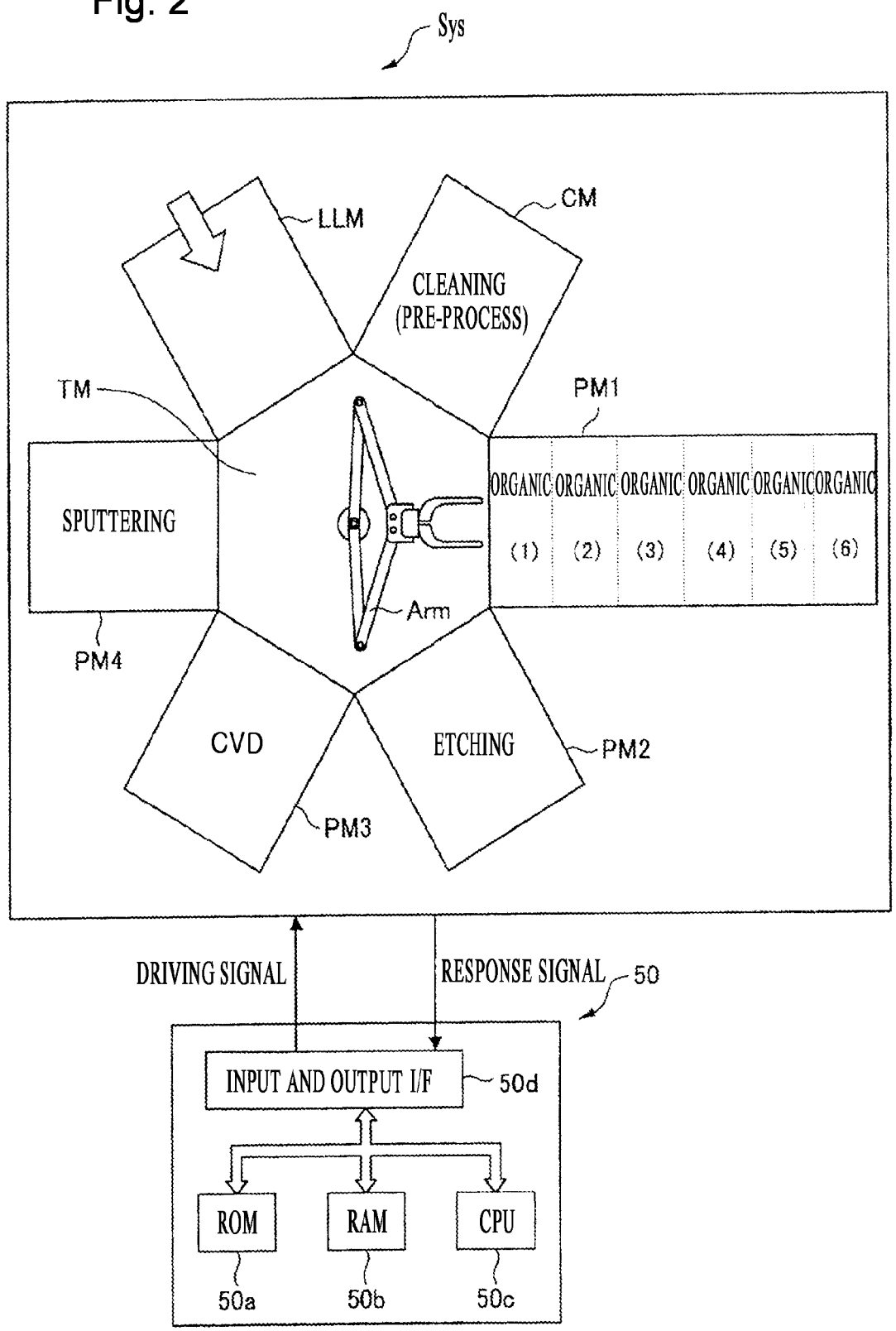
FIG. 2 is a diagram schematically showing a substrate-processing system according to the embodiment of the present invention.

The organic EL electronic device described above may be manufactured in a cluster type substrate-processing system Sys shown in FIG. 2. An entire structure of the substrate-processing system Sys will be described first, and then the transfer and process of the substrate G in the substrate-processing system Sys will be described.

(Entire Structure of Substrate-Processing System, and Transfer and Each Process of Substrate)

The substrate-processing system Sys according to an embodiment of the present invention is a cluster-type manufacturing apparatus including a plurality of processing containers. The substrate-processing system Sys includes a load lock module LLM, a transfer module TM, a cleaning module CM or a pre-processing module, and 4 process modules PM1 through PM4 that are processing containers each performing different processes.

The load lock module LLM is a vacuum transfer module whose inside is maintained in a depressurized state in order to transfer the substrate G received from the atmosphere to the transfer module TM that is in a depressurized state. The transfer module TM includes a bendable/stretchable and swivelable multi-joint-shaped transfer arm Arm installed roughly at the center. The substrate G is first transferred from the load lock module LLM to the cleaning module CM, to the process module PM1, and then additionally to the process modules PM2 through PM4 by using the transfer arm Arm. In the cleaning module CM, a contaminant (mainly, an organic material) attached to the surface of the ITO 10 which serves as an anode layer formed on the substrate G is removed.

In the PM1 through PM4, first, 6 layers of the organic layer 20 are consecutively formed on the surface of the ITO via deposition in the process module PM1. Then, the substrate G is transferred to the PM4. In the PM4, the metal electrode 30 doped with cesium is formed on the organic layer 20 of the substrate G via sputtering. Then, the substrate G is transferred to the PM2, and a part of the organic layer 20 is removed via etching, by using the metal electrode 30 as a pattern mask.

Next, the substrate G is transferred back to the PM4, and a sidewall of the metal electrode 30 is formed via sputtering in the PM4. Lastly, the substrate G is transferred to the PM3, and the sealing film 40 is formed via CVD in the PM3.

(Controller)

A controller 50 controls the above-mentioned process using the substrate-processing system Sys. The controller 50 includes a ROM 50a, a RAM 50b, a CPU 50c, and an input and output I/F(interface) 50d. The ROM 50a and the RAM 50b store, for example, data or control programs to control a mixing amount of cesium while forming the metal electrode 30.

The CPU 50c generates a driving signal for controlling the transfer or process in the substrate-processing system Sys, by using the data or control programs stored in the ROM 50a and the RAM 50b. The input and output I/F 50d outputs the driving signal generated by the CPU 50c to the substrate-processing system Sys, and thus inputs a response signal outputted from the substrate-processing system Sys and transfers the response signal to the CPU 50c.

An internal structure of a deposition apparatus (PM1) that is included in the substrate-processing system Sys and used to form the organic film, and a stacked structure of the organic film 20 will now be briefly described with reference to FIGS. 3 and 4, and then an internal structure and a method of controlling a film-forming apparatus (sputtering apparatus) for forming the metal electrode 30 mixed with cesium will be described in detail with reference to FIGS. 5 through 8.

(Forming Organic Film: PM1)

Figure 3:
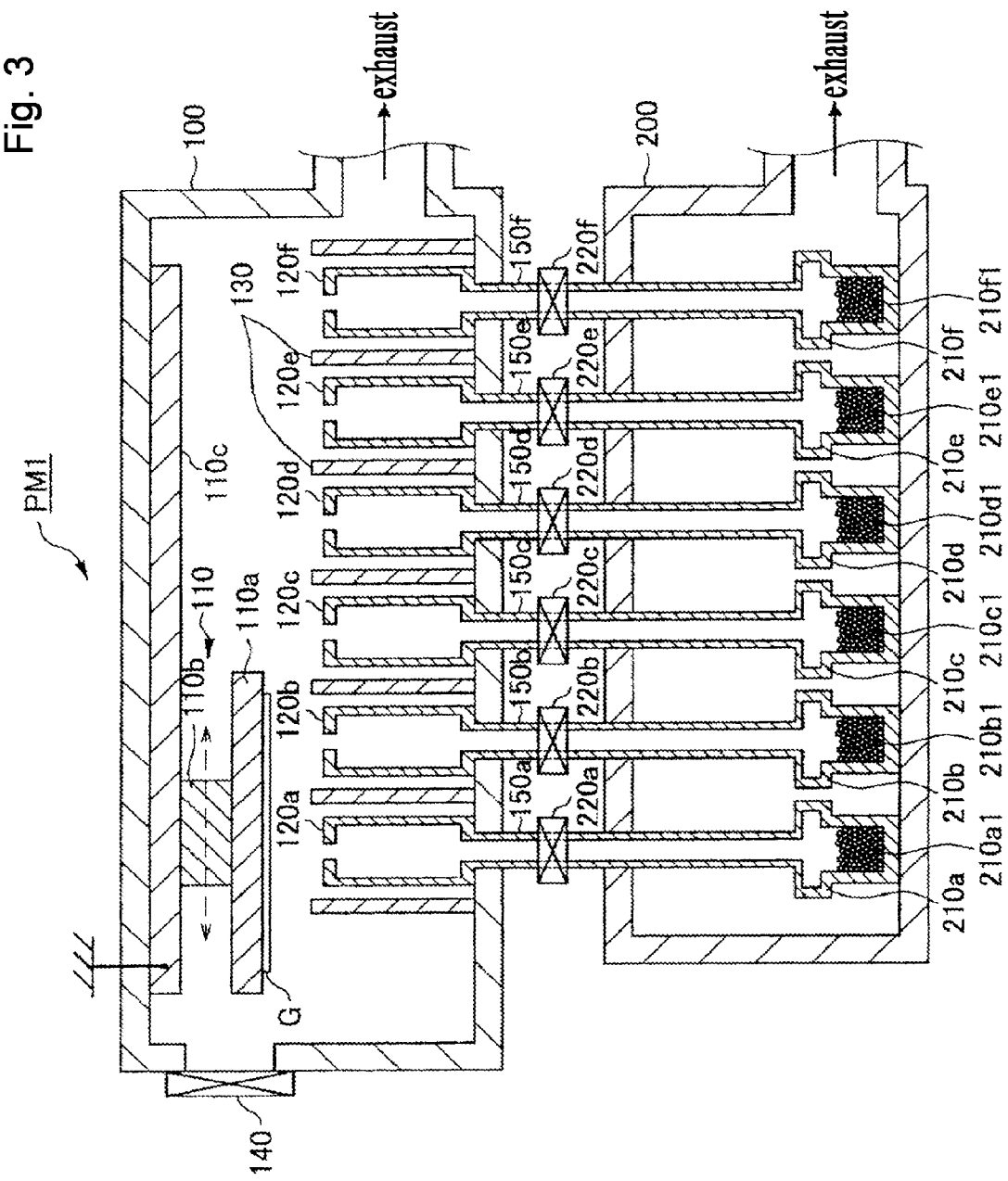
FIG. 3 is a vertical cross-section view of a PM1 for performing a process of consecutively forming 6 layers, according to the embodiment of the present invention.

FIG. 3 schematically shows a vertical cross-section of the PM1. Referring to FIG. 3, the PM1 includes a first processing container 100 and a second processing container 200, and 6 layers of the organic layer 20 are consecutively formed in the first processing container 100. Also, in FIG. 3, the controller 50 for controlling consecutively formation the organic layer 20 is not shown.

The first processing container 100 has a rectangular parallelepiped shape, and includes a sliding mechanism 110, six extraction mechanisms 120a through 120f, and seven barrier walls 130. A gate valve 140 capable of carrying the substrate G in and out by opening or closing is installed on a sidewall of the first processing container 100.

The sliding mechanism 110 includes a stage 110a, a supporter 110b, and a sliding apparatus 110c. The stage 110a is supported by the supporter 110b, and the stage 110a absorbs electrostatically the substrate G carried in from the gate valve 140 by a high voltage supplied from a high voltage source (not shown). The sliding is apparatus 110c is installed on the ceiling of the first processing container 100 and is also grounded, and thus slides the substrate G together with the stage 110a and the supporter 110b in a length direction of the first processing container 100. Thus, the substrate G is moved parallelly in a space slightly above each of the extraction mechanisms 120.

The six extraction mechanisms 120a through 120f have identical shapes and identical structures and are arranged in parallel to each other at regular intervals. The extraction mechanisms 120a through 120f have hollow rectangular interiors, and organic molecules are extracted from openings formed in the upper center of the extraction mechanisms 120a through 120f. The bottoms of the extraction mechanisms 120a through 120f are connected to connection pipes 150a through 150f that penetrate a bottom wall of the first processing container 100.

The barrier walls 130 separate each of the extraction mechanisms 120 from one another, thereby preventing the organic molecule extracted from each of the openings of the extraction mechanisms 120a through 120f from being mixed with the organic molecule extracted from the opening of the next extraction mechanism.

The second processing container 200 includes six deposition sources 210a through 210f having identical shapes and identical structures. Reception units 210a1 through 210f1 of the deposition sources 210a through 210f respectively contain organic materials, are heated to a high temperature of about 200 to about 500° C. in order to vaporize the organic material. The vaporization denotes not only a phenomenon in which liquid changes to gas but also a phenomenon in which solid is directly changed to gas by skipping a liquid phase(that is, sublimation).

Upper portions of the deposition sources 210a through 210f are connected to the connection pipes 150a through 150f, respectively. By maintaining each of the connection pipes 150 at a high temperature, the organic molecules vaporized in each of the deposition sources 210 do not stick to each of the connection pipes 150 and are emitted from the openings of each of the extraction mechanisms 120 to the inner space of the first processing container 100 via each of the connection pipes 150. Also, the second processing container 200 is depressurized to a desired vacuum level by an not shown exhaust mechanism so that the inner space of the second processing container 200 is maintained to a predetermined vacuum level. Valves 220a through 220f are is attached to each of the connection pipes 150 respectively, thereby controlling communication and cutoff with the organic materials.

Figure 4:
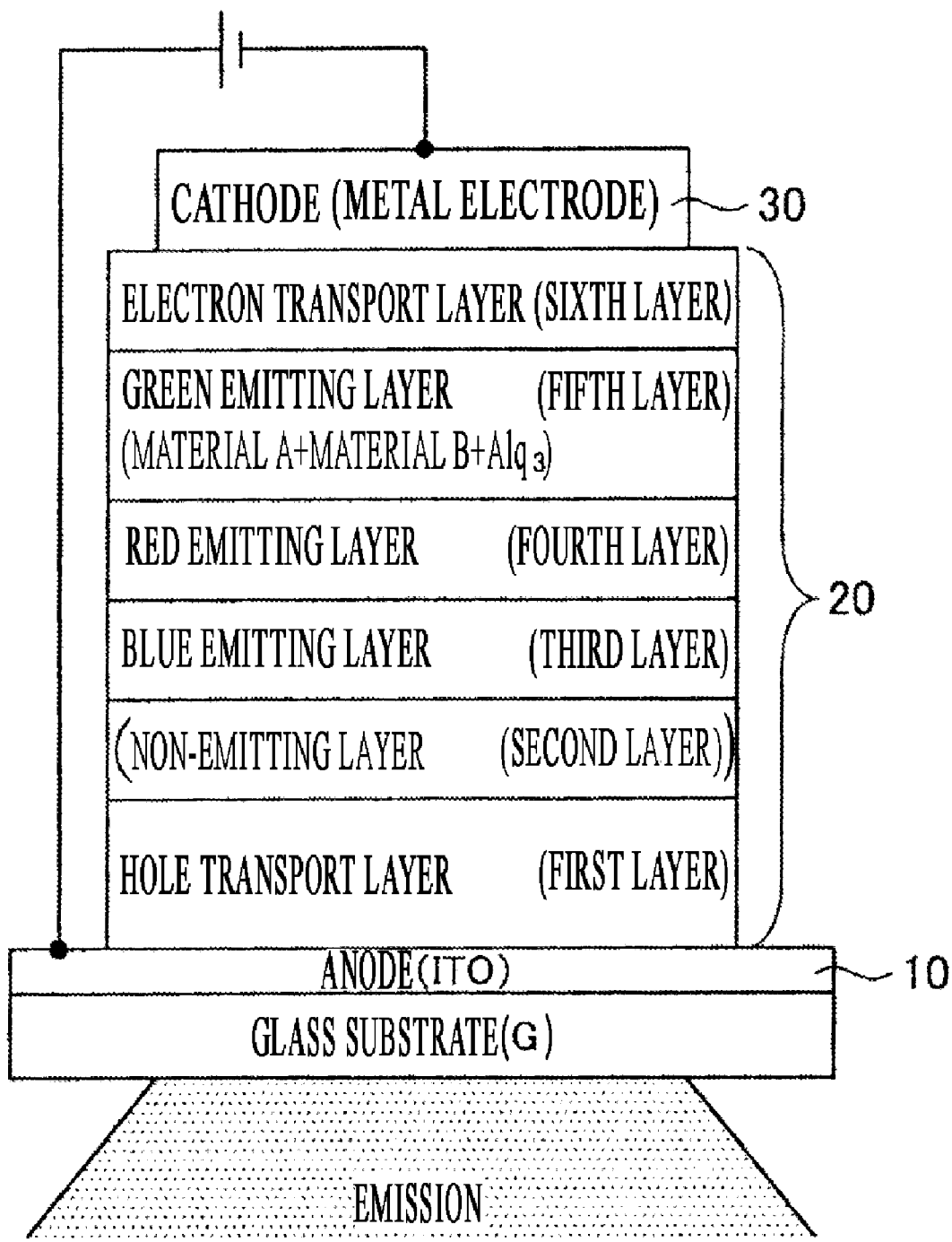
FIG. 4 is a diagram showing an organic EL element formed according to a process of consecutively forming 6 layers, according to an embodiment of the present invention.

Among the organic molecules extracted from each of the extraction mechanisms 120, the organic molecule extracted from the extraction mechanism 120a is first attached to the ITO (anode) 10 on the substrate G that moves above the extraction mechanism 120a at a predetermined speed, and thus a hole transport layer of a first layer is formed on the substrate G as shown in FIG. 4. Then, as the substrate G moves in the order from the extraction mechanism 120b to the extraction mechanism 120f, the organic molecules extracted from the extraction mechanisms 120b through 120f are each deposited on the substrate, and thus the organic layers 20(second through sixth layers) are sequentially formed. As such, the organic layer 20 shown in "b" of FIG. 1 is formed on the ITO (anode) 10 of the substrate G shown in "a" of FIG. 1 which shows each step of the process for manufacturing the organic EL.

(Forming Metal Electrode Mixed with Cesium: PM4)

Figure 5:
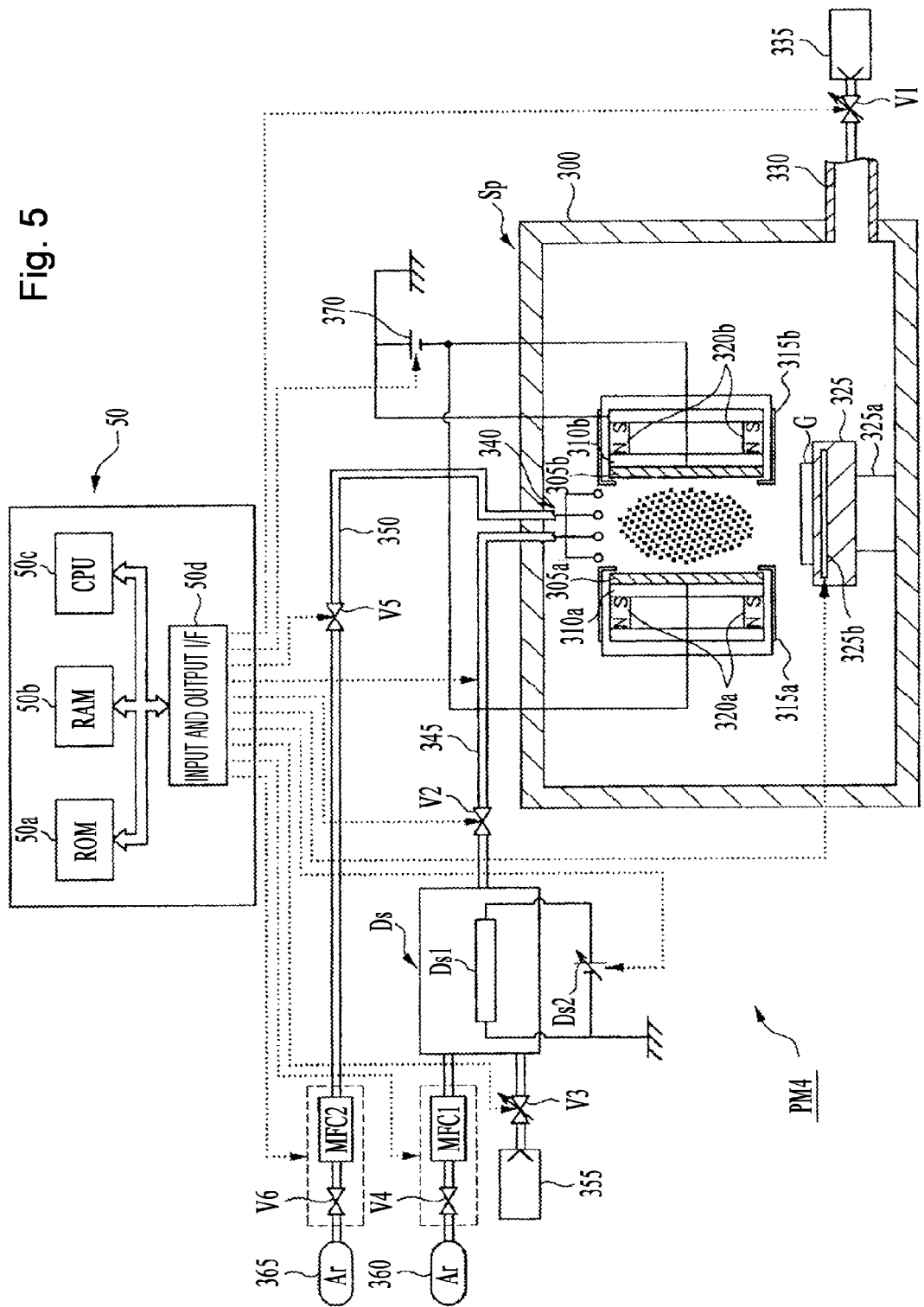
FIG. 5 is a vertical cross-section view of a PM4 for performing a film-forming process, according to the embodiment of the present invention.

The metal electrode 30 mixed with cesium is formed on the organic layer 20. The metal electrode 30 mixed with cesium is formed via sputtering in the PM4. As shown in FIG. 5, the PM4 includes a sputtering apparatus Sp. A dispenser Ds is installed outside the sputtering apparatus Sp. The sputtering apparatus Sp, the dispenser Ds, and other elements are driven by the driving signal outputted from the controller 50.

Also, the sputtering apparatus Sp corresponds to a film-forming apparatus for forming a cathode (the metal electrode 30) on the organic layer 20 formed on the substrate G in a processing container, and the dispenser Ds corresponds to an evaporation source that is formed outside the processing container and evaporates a second metal, such as cesium, having a lower work function than a first metal, such as silver, forming the metal electrode 30, by heating the second metal.

(Internal Structure of Sputtering Apparatus)

First, an internal structure of the sputtering apparatus Sp will be described. The sputtering apparatus Sp includes the processing container 300 for generating plasma and forming the metal electrode 30 via sputtering therein. The processing container 300 includes a pair of target materials 305a and 305b, packing plates 310a and 310b, target holders 315a and 315b, magnetic-field generating means 320a and 320b, a stage 325, an exhaust pipe 330, and a gas shower head 340.

The pair of target materials 305a and 305b face each other in such a way that sputtering surfaces of the target materials 305a and 305b are parallel to each other, while being spaced apart from each other predetermined distance from the almost center of the processing container 300. The target materials 305a and 305b (corresponding to the first metal for forming the cathode of the organic EL element) may be silver or aluminum having low electric resistance and relatively high reflectivity. In the present embodiment, the target materials 305a and 305b are formed of silver.

The pair of target materials 305a and 305b are respectively held by the target holders 315a and 315b and the packing plates 310a and 310b. The magnetic-field generating means 320a and 320b are magnets in the present embodiment, wherein the magnetic-field generating means 320a and 320b are disposed such that a rear surface of the target material 305a has a south pole, and a rear surface of the target material 305b has a north pole. Accordingly, a magnetic field perpendicular to the target materials 305a and 305b is generated so as to surround a space between the target materials 305a and 305b.

The stage 325 is formed on a bottom surface of the processing container 300 and is supported by a supporter 325a. A temperature adjusting means 325b is embedded in the stage 325 to adjust heat emitting amount according to the driving signal from the controller 50. The stage 325 electrostatically adsorbs the substrate G according to a high voltage applied from the high voltage source.

The exhaust pipe 330 is connected to a vacuum pump 335 through an opening-degree adjustable valve V1. By adjusting an opening degree of the opening-degree adjustable valve based on the driving signal output from the controller 50, the inner processing container 300 may be controlled to a desired vacuum pressure.

The gas shower head 340 is formed on facing sides of the pair of target materials 305a and 305b. The gas shower head 340 is branched to be connected to a first gas supply pipe 345 and a second gas supply pipe 350. An upper stream side of the first gas supply pipe 345 is connected to the dispenser Ds through a valve V2.

An evaporation container Ds1 is formed inside the dispenser Ds to contain an is alkali metal, such as cesium. The evaporation container Ds1 is connected to a power supply source. A voltage of the power supply source Ds2 is controlled based on the driving signal output form the controller 50, thereby controlling a current flowing through the evaporation container Ds1. Accordingly, the evaporation container Ds1 is heated up to a desired temperature. Accordingly, an evaporation amount of cesium contained in the evaporation container Ds1 may be adjusted. Also, a metal (corresponding to the second metal) contained in the evaporation container Ds1 may be an alkali metal having a lower work function than the first metal. Examples of the alkali metal include lithium, sodium, potassium, rubidium, and cesium.

The dispenser Ds is connected to a vacuum pump 355 through an opening-degree adjustable valve V3. An opening degree of the opening-degree adjustable valve V3 is adjusted based on the driving signal output from the controller 50, and thus the inner dispenser Ds is controlled to a desired vacuum pressure.

Also, the dispenser Ds is connected to a mass flow controller MFC1 for adjusting a flow rate of a gas, and to an argon gas supply source 360 through a valve V4. An argon gas outputted from the argon gas supply source 360 is supplied to the processing container 300 through a path (a first gas supply path) of the first gas supply pipe 345. Supply/cutoff and a flow rate of the argon gas is adjusted by controlling the mass flow controller MFC1 and the valve V4 based on the driving signal output from the controller 50.

Accordingly, the cesium evaporated in the dispenser Ds is transferred into the processing container 300 through the path of the inside of the first gas supply pipe 345 by using a certain amount of argon gas transmitted into the dispenser Ds as a carrier gas. Here, temperatures of the dispenser Ds and a pipe (including the first gas supply pipe 345) through which the argon gas and evaporated cesium pass are adjusted to be, for example, 400° C. or higher, by heating a heater (not shown) installed on a wall of the pipe or the dispenser Ds, based on the driving signal output from the controller 50. Accordingly, when the evaporated cesium is transferred by the argon gas, the evaporated cesium may be prevented from being liquefied by being adhered to the pipe, or the like. Accordingly, a ratio of the second metal mixed in the metal electrode 30 may be precisely controlled, while increasing an efficiency of use of material.

The second gas supply pipe 350 is a different pipe independent of the first gas is supply pipe 345, and is connected to an argon gas supply source 365 through a valve V5, a mass flow controller MFC2, and a valve V6. An argon gas outputted from the argon gas supply source 365 is supplied into the processing container 300 through a path (second gas supply path) of the inside of the second gas supply pipe 350. Supply/cutoff and a flow rate of the argon gas are adjusted by controlling the mass flow controller MFC2 and the valve V6 based on the driving signal output from the controller 50. Also, a supply path of the argon gas may be changed by switching the valves V2 and V5.

A direct current source 370 applies a desired direct current voltage (DC static electric power) based on the driving signal output from the controller 50, by using each of the target materials 305a and 305b as a cathode, and the packing plate 310b as an anode. Accordingly, plasma is generated in the space between the target materials 305a and 305b. Electric power is not limited to the DC static electric power, but may be an AC electric power, RF electric power, MF electric power, a pulse DC electric power, or an overlapping electric power thereof. Also, the direct current source 370 is an example of an energy source for supplying desired energy into the processing container 300.

(Forming of Metal Electrode)

Now, a process of forming the metal electrode 30 while mixing the metal electrode 30 with cesium inside the sputtering apparatus Sp having the above-described structure will be described with reference to FIG. 6, which shows the procedure is performed by the controller 50.

Figure 7A:
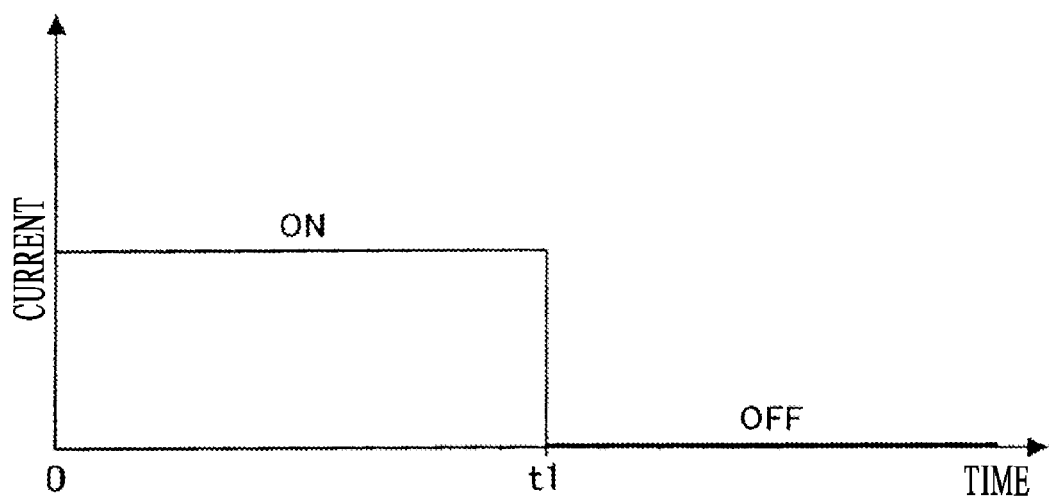
FIG. 7A is a graph showing a current value with respect to a film-forming time.

The process of forming metal electrode starts in step 600, and the controller 50 controls a temperature of each element in step 605. As one example of controlling the temperature, the controller 50 controls a current value (a voltage value of the power supply source Ds2) flowing through the evaporation container Ds1 formed in the dispenser Ds. For example, as shown in FIG. 7A, when the ROM 50a stores data for controlling the current value with respect to a film-forming time, the controller 50 may set the current value to be a predetermined value (an ON value) of FIG. 7A in step 605, based on the data stored in the ROM 50a. As another example of controlling the temperature, the controller 50 may control the temperature adjusting means 325b embedded in the stage 325, or a heater (not shown) embedded in the first or second is gas supply pipe 345 or 350 to a predetermined temperature, such as 400° C. or higher.

Then, the controller 50 supplies a raw material into the sputtering apparatus Sp in step 610. In detail, the controller 50 opens the valves V4 and V2 by adjusting an opening degree of the mass flow controller MFC1. Accordingly, the steam of cesium in the dispenser Ds is supplied into the processing container 300 through the inside of the first gas supply pipe 345, by using the argon gas supplied from the argon gas supply source 360 as a carrier gas.

The controller 50 may separately supply the argon gas through the second gas supply pipe 350. In this case, the controller 50 opens the valves V5 and V6 by adjusting an opening degree of the mass flow controller MFC2. Accordingly, the argon gas supplied from the argon gas supply source 365 is supplied into the processing container through the second gas supply pipe 350.

Then, in step 615, the controller 50 controls the opening degree of the opening-degree adjustable valve V1. Accordingly, the inside of the processing container 300 maintains a desired depressurized state. Next, in step 620, the controller 50 controls the direct current source 370 to apply a predetermined DC voltage on the target materials 305a and 305b.

A film-forming process performed in the space between the target materials 305a and 305b at this time will be described with reference to FIG. 8. As shown in "a" of FIG. 8, the argon gas supplied from the gas shower head 340 is ionized (plasmatized) by energy of the DC voltage, and is fed toward the target materials 305a and 305b. Then, the argon gas collides with each of the target materials 305a and 305b, thereby generating silver atoms from each of the target materials 305a and 305b.

Meanwhile, cesium is mixed in the plasma in the space and a part of the cesium is adhered to the target materials 305a and 305b, thereby drifting in the plasma while being ionized ($Cs^+$) by colliding with ionized argon gas ($Ar^+$) or turning back to a ground state (Cs).

Figure 8:
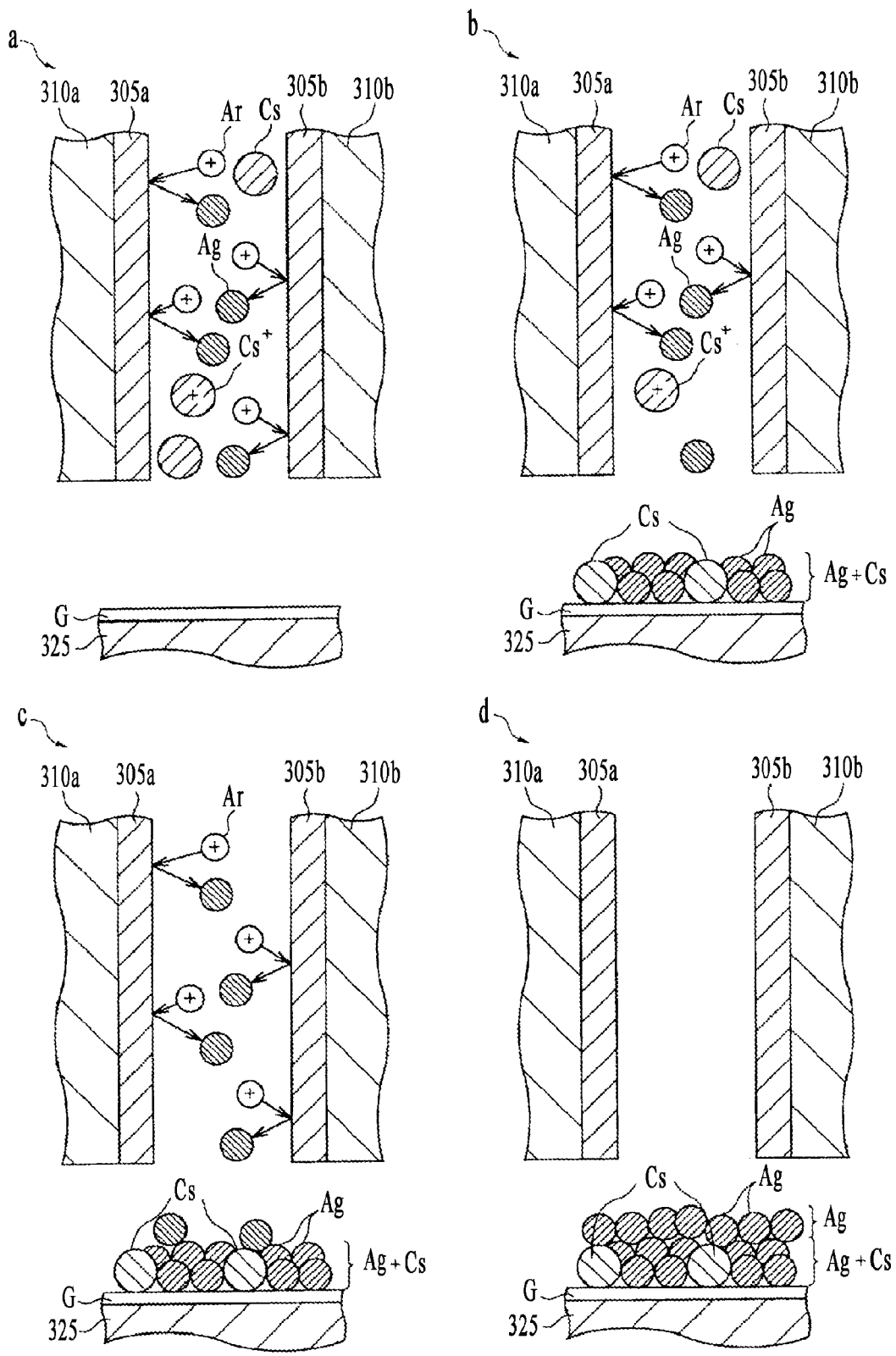
FIG. 8 is a diagram for describing a film-forming process of a metal electrode.

As shown in "b" of FIG. 8, when the silver atoms generated from the target materials 305a and 305b are gradually stacked on the substrate G, the cesium is mixed during film-formation of silver. Accordingly, the metal electrode (cathode) 30 mixed with cesium (Cs) that increases electron injection efficiency may be formed. As a result, active cesium (Cs) may be covered with silver before the cesium reacts with moisture, is nitrogen, oxygen, or the like remaining in the processing container. Accordingly, a highly efficient organic EL electronic device having high electron injection efficiency may be manufactured stably.

Here, a ratio of the cesium mixed in the metal electrode is very important. This is well known from a research result that, it is better that in a conventional organic EL electronic device manufactured by stacking an electron transport layer, an electron injection layer, and a metal electrode(cathode) on a light-emitting layer, a thickness of an alkali metal forming the electron injection layer is relatively smaller than a thickness of a metal electrode (the cathode). For example, it has been reported that the thickness of lithium, which is an example of the alkali metal, may be from about 0.5 to about 2.0 nm, and if the thickness is higher, electron injection efficiency is deteriorated.

Figure 6:
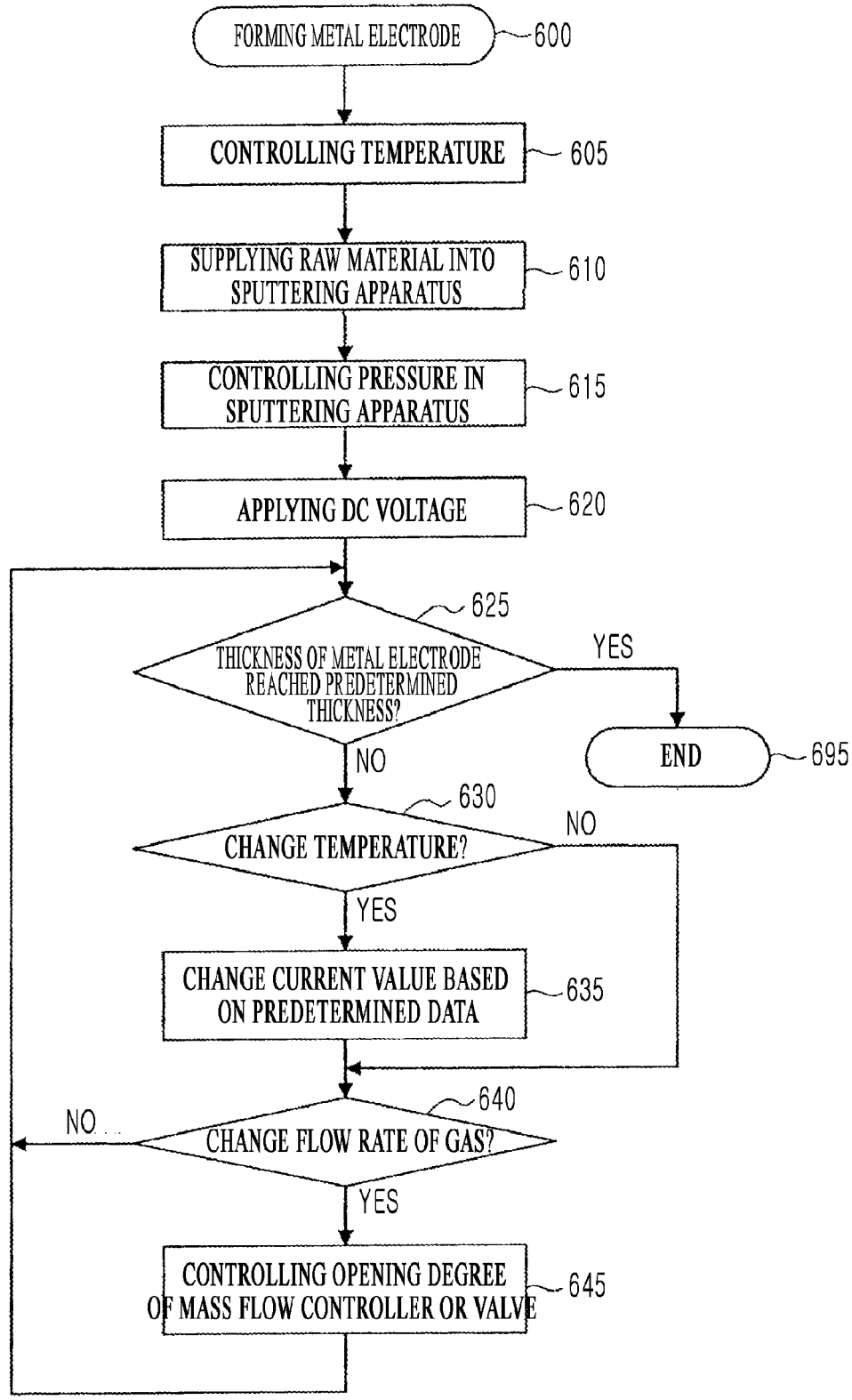
FIG. 6 is a flowchart showing a process of forming a metal electrode.

Thus, in the present embodiment, considering the importance of the mixed ratio of cesium, the controller 50 controls the temperature of the dispenser Ds in step 605 of FIG. 6, as a method of controlling the ratio of cesium mixed in the metal electrode 30. Accordingly, an evaporation rate (or vaporization rate) of an alkali metal, such as cesium, contained in the dispenser Ds may be controlled. In other words, when the temperature of the dispenser Ds is increased, the evaporation rate of the cesium is also increased, and thus the ratio of the cesium mixed in the metal electrode 30 may be increased. On the other hand, when the temperature of the dispenser Ds is decreased, the evaporation rate of the cesium is decreased, and thus the ratio of the cesium mixed in the metal electrode 30 may be decreased.

As such, while the metal electrode 30 mixed with the cesium is gradually stacked, the controller 50 repeatedly performs the steps 625 through 645 of FIG. 6. In the state of "b" of FIG. 8, since the thickness of the metal electrode 30 has not yet reached a predetermined thickness for completing the film-forming process, the controller 50 determines whether to change the temperature of the dispenser Ds in step 630. Here, when a time t1 (referring to FIG. 7A) has passed after starting the present process, the controller 50 determines to change the temperature of the dispenser Ds, and controls the current value to be 0 (an OFF value) in step 635.

According to the above-mentioned control, the cesium (Cs) is not rapidly supplied from the dispenser Ds, and thus after a predetermined time, only the argon gas (Ar) is supplied into the processing container as shown in "c" of FIG. 8. The supplied argon is gas (Ar) is ionized as described above, and collides with the target materials 305a and 305b, thereby generating the silver (Ag). Thus, as shown in "d" of FIG. 8, a layer (Ag) of the metal electrode 30 not mixed with the cesium (Cs) is stacked on a layer (Ag+Cs) of the metal electrode 30 mixed with cesium.

The controller 50 may also change a flow rate of gas in step 640. When the flow rate is changed, the controller 50 may, for example, change the flow rate of the argon gas supplied into the processing container by changing the opening degree of the mass flow controller MFC1, or opening and shutting of the valve V4, in step 645.

Alternatively, the controller 50 may, for example, change the flow rate of the argon gas supplied into the processing container by changing the opening degree of the mass flow controller MFC2, or opening and shutting of the valve V6, in step 645.

Alternatively, the controller 50 may, for example, change the flow rate of the argon gas supplied into the processing container by controlling opening and shutting of the valve V2 or V5, in step 645. The flow rates may be variously controlled by combination of control of the mass flow controllers MFC, and each of the valves V.

As such, when the thickness of the metal electrode 30 mixed with cesium reaches the predetermined thickness, the controller 50 performs step 695 after step 625, thereby completing the process.

As described above, according to the method of forming the metal electrode 30 according to the present embodiment, an alkali metal is mixed in the metal electrode, thereby substantially forming an electron injection layer and a cathode simultaneously. Accordingly, the active alkali metal is prevented from reacting with moisture, nitrogen, oxygen, or the like, thereby manufacturing an organic EL electronic device having high electron injection efficiency.

Also, according to the method of forming the metal electrode 30 according to the present embodiment, a ratio of the alkali metal mixed in the metal electrode 30 may be controlled by using various control method. In detail, as described above, the temperature of the dispenser Ds is controlled to control an evaporation rate of the alkali metal contained in the dispenser Ds, thereby controlling the ratio of the alkali metal mixed in the metal electrode 30.

Alternatively, a flow rate of an inert gas, such as the argon gas, is controlled to control the amount of the alkali metal transported per unit hour, thereby controlling the is ratio of the alkali metal mixed in the metal electrode 30. By doing so, the amount of the alkali metal mixed during formation of the metal electrode may be accurately controlled by approximate control of the temperature control and precise control of the flow rate of the inert gas constituting a carrier gas.

The flow rate may be controlled variously as follows. For example, as described above, the second gas supply pipe 350 for supplying the argon gas as a sputtering gas into the processing container may be formed in the sputtering apparatus Sp, and a flow rate of the sputtering gas supplied from the second gas supply pipe 350 may be controlled, thereby controlling the ratio of the alkali metal mixed in the metal electrode 30.

The ratio of the alkali metal mixed in the metal electrode 30 may be controlled by controlling a ratio of the total flow rate of the gas supplied from the first gas supply pipe 345 into the processing container to the total flow rate of the gas supplied from the second gas supply pipe 350 to the processing container.

In addition, for example, by forming a thin film formed by mixing an alkali metal in a target atom (Ag), to a predetermined thickness, and then stopping the evaporated alkali metal from being supplied from the first gas supply pipe 345, the metal electrode in which the alkali metal is not mixed on a layer of the metal electrode in which the alkali metal is mixed may be formed.

Similarly, by forming a thin film formed by mixing an alkali metal in a target atom (Ag), to a desired thickness, stopping the gas from being supplied from the first gas supply pipe 345, and then supplying only the sputtering gas supplied from the second gas supply pipe 350 to the processing container, the metal electrode may in which the alkali metal is not mixed on a layer of the metal electrode in which the alkali metal is mixed may be formed.

Figure 7B:
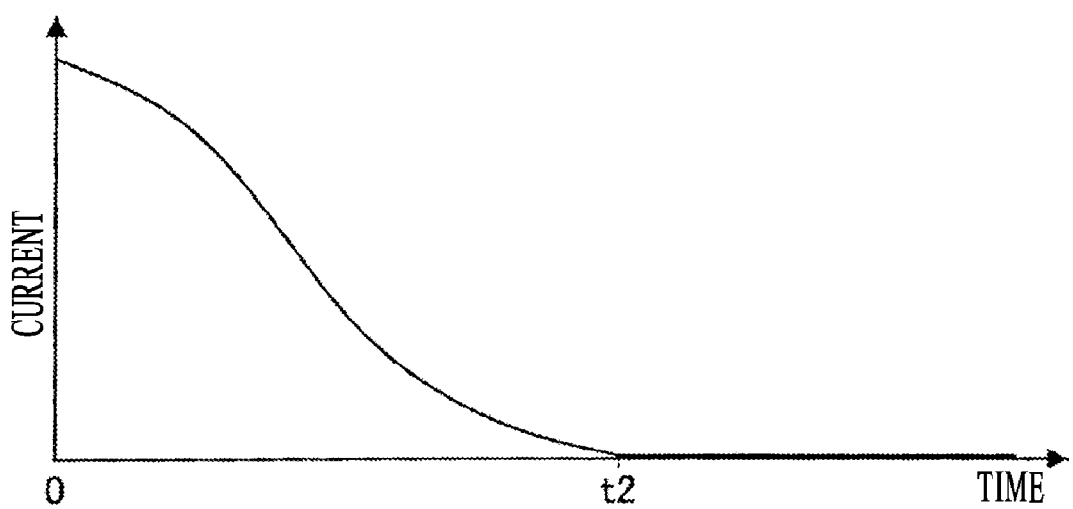
FIG. 7B is a graph showing a current value with respect to a film-forming time.

Also, as shown in FIG. 7B, the current amount flowing through the dispenser Ds may be gradually decreased so as to gradually decrease the evaporation amount of the alkali metal, thereby controlling the amount of the evaporated alkali metal supplied from the first gas supply pipe 345 into the processing container to be relatively decreased with respect to the flow rate of the argon gas supplied into the processing container.

Accordingly, the mixing amount of the alkali metal may be gradually decreased while forming the metal electrode 30. Consequently, the alkali metal is mixed in the is metal electrode 30 in such a way that the number of atoms of the alkali metal increases toward the organic layer 20, and decreases away from the organic layer 20. Thus, the alkali metal is barely mixed in the metal electrode 30 after a film-forming time t2.

As described above, according to the embodiments, it is possible to simultaneously form a film of a material having a low work function and a cathode, and thus a highly efficient organic EL electronic device can be stably manufactured.

In the above-mentioned embodiments, operations of each element are related to each other, and considering the relation between the elements, the operations may be replaced by a series of operations. Due to this replacement, the embodiments of a film-forming apparatus for manufacturing the organic EL electronic device may be embodiments of a film-forming method for manufacturing the device and a method of controlling a film-forming apparatus for manufacturing the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

For example, in the present embodiments, the alkali metal is mixed in the cathode (the metal electrode 30), but while mixing the alkali metal in the cathode (the metal electrode 30), the alkali metal may also be mixed in the sixth layer of the organic layer 20 (refer to FIG. 4).

For example, in the present embodiments, the alkali metal is mixed in the sixth layer of the organic layer 20, but while mixing the alkali metal in the organic layer 20, the alkali metal may also be mixed in the metal electrode 30 formed after the organic layer 20.

The size of the substrate G may be equal to or greater than 730 mm×920 mm. For example, the size of the substrate G may be a G4.5 substrate size of 730 mm×920 mm (diameter of the inner space of a chamber: 1000 mm×1190 mm) a G5 substrate size of 1100 mm×1300 mm (diameter of the inner space of a chamber: 1470 mm×1590 mm). A target object on which an element is formed is not limited to a substrate G having one of the aforementioned sizes, and may be a 200 mm or 300 mm silicon wafer.

The invention claimed is:

1. A method of controlling a film-forming apparatus for forming a cathode on an organic layer formed on a target object in a processing container,
wherein the film-forming apparatus comprises:
a target material formed in the processing container and formed of a first metal constituting a main material of the cathode;
an evaporation source formed outside the processing container and evaporating a second metal having a lower work function than the first metal by heating the second metal;
a first gas supply path communicating with the evaporation source to transport the evaporated second metal into the processing container by using an inert gas; and
an energy source supplying desired energy into the processing container,
the method comprising:
generating plasma by exciting the inert gas supplied from the first gas supply path by using the supplied energy, and controlling a ratio of the second metal mixed in the cathode while forming the cathode by using a target atom of the first metal, wherein the target atom is generated from the target material when the target material contacts the generated plasma.

2. The method of claim 1, wherein the ratio of the second metal mixed in the cathode is controlled by controlling a temperature of the evaporation source.

3. The method of claim 1, wherein the ratio of the second metal mixed in the cathode is controlled by controlling a flow rate of the inert gas.

4. The method of claim 1,
wherein the film-forming apparatus further comprises a second gas supply path supplying a sputtering gas into the processing container,
wherein the ratio of the second metal mixed in the cathode is controlled by controlling a flow rate of the sputtering gas supplied from the second gas supply path.

5. The method of claim 1,
wherein the film-forming apparatus further comprises a second gas supply path supplying a sputtering gas into the processing container,
wherein the ratio of the second metal mixed in the cathode is controlled by controlling a ratio of a total flow rate of a gas supplied from the first gas supply path into the processing container to a total flow rate of a gas supplied from the second gas supply path into the processing container.

6. The method of claim 2, wherein the temperature of the evaporation source is controlled so as to stop supplying the second evaporated metal from the first gas supply path, after forming a thin film, in which the second metal is mixed in the first metal, to a desired thickness.

7. The method of claim 5, wherein the gas supply from the first gas supply path is stopped after forming a thin film, in which the second metal is mixed in the first metal, to a desired thickness and only the sputtering gas supplied from the second gas supply path is supplied to the processing container.

8. The method of claim 5, wherein the total flow rate of the gas supplied from the first gas supply path into the processing container is controlled to be relatively decreased with respect to the total flow rate of the gas supplied from the second gas supply path into the processing container.

9. The method of claim 5, wherein an amount of of the evaporated second metal supplied from the first gas supply path into the processing container is controlled to be relatively decreased with respect to the flow rate of the inert gas supplied from the first gas supply path into the processing container.

10. The method of claim 1, wherein a pipe for forming the first gas supply path is controlled to be 400° C. or higher.

11. A film-forming method for forming a cathode on an organic layer formed on a target object in a processing container, the film-forming method comprising:
evaporating a second metal having a lower work function than a first metal constituting a main material of the cathode by heating the second metal, by using an evaporation source formed outside the processing container;
transferring the evaporated second metal into the processing container through a first gas supply path connected to the evaporation source, by using an inert gas as a carrier gas;
supplying desired energy into the processing container; and
generating plasma by exciting the inert gas supplied from the first gas supply path by using the supplied energy, and mixing the second metal in the cathode while the cathode is being formed by using a target atom of the first metal, wherein the target atom is generated from the target material when the target material contacts the generated plasma.

* * * * *